US012568772B2

(12) United States Patent
Katakam et al.

(10) Patent No.: US 12,568,772 B2
(45) Date of Patent: Mar. 3, 2026

(54) MRAM WITH A MULTI-COMPONENT, MULTI-LAYER BOTTOM ELECTRODE

(71) Applicant: INTERNATIONAL BUSINESS MACHINES CORPORATION, Armonk, NY (US)

(72) Inventors: Shravana Kumar Katakam, Lehi, UT (US); Ashim Dutta, Clifton Park, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 537 days.

(21) Appl. No.: 18/081,960

(22) Filed: Dec. 15, 2022

(65) Prior Publication Data

US 2024/0206346 A1     Jun. 20, 2024

(51) Int. Cl.
*H10N 50/80* (2023.01)
*H10B 61/00* (2023.01)
*H10N 50/01* (2023.01)

(52) U.S. Cl.
CPC ............. *H10N 50/80* (2023.02); *H10B 61/00* (2023.02); *H10N 50/01* (2023.02)

(58) Field of Classification Search
CPC ............................ H10B 61/00; G11C 2213/51
See application file for complete search history.

(56) References Cited

U.S. PATENT DOCUMENTS

| | | | |
|---|---|---|---|
| 6,731,007 B1 | 5/2004 | Saito et al. | |
| 8,883,520 B2 | 11/2014 | Satoh et al. | |
| 9,343,659 B1 | 5/2016 | Lu et al. | |
| 9,373,782 B2 | 6/2016 | Li et al. | |
| 9,431,343 B1 | 8/2016 | Lee et al. | |
| 10,069,064 B1 | 9/2018 | Haq et al. | |
| 10,096,649 B2 | 10/2018 | Park et al. | |
| 10,270,025 B2 | 4/2019 | Chuang et al. | |
| 10,418,415 B2 | 9/2019 | Wiegand et al. | |
| 10,475,990 B2 | 11/2019 | Hsieh et al. | |
| 11,171,054 B2 | 11/2021 | Nguyen et al. | |
| 2013/0119494 A1 | 5/2013 | Li et al. | |
| 2016/0365505 A1 | 12/2016 | Lu et al. | |
| 2020/0220072 A1* | 7/2020 | Marchack | H10B 61/00 |
| 2020/0321394 A1* | 10/2020 | Hashemi | H10B 61/10 |
| 2021/0242399 A1* | 8/2021 | Lee | H10N 70/826 |
| 2022/0393101 A1* | 12/2022 | Lee | H10N 50/01 |

* cited by examiner

*Primary Examiner* — Shih Tsun A Chou
(74) *Attorney, Agent, or Firm* — Kelsey M. Skodje

(57) ABSTRACT

A magnetoresistive random access memory (MRAM) structure, a system, and a method of forming an MRAM structure. The MRAM structure may include a bottom electrode. The bottom electrode may include a diffusion barrier. The bottom electrode may further include a dielectric that surrounds one or more sidewalls of the diffusion barrier. The method may include depositing a first dielectric, where a metal component remains uncovered by the dielectric. The method may further include depositing a diffusion barrier on at least the metal component. The method may further include depositing an electrode layer on the first dielectric and the diffusion barrier, resulting in a bottom electrode comprising the electrode layer, the first dielectric, and the diffusion barrier.

12 Claims, 12 Drawing Sheets

100

300

1200

MRAM WITH A MULTI-COMPONENT, MULTI-LAYER BOTTOM ELECTRODE

BACKGROUND

The present disclosure relates to magnetoresistive random access memory (MRAM) and, more specifically, to protecting the conductive layer of the bottom electrode of the MRAM by utilizing a multi-component, multi-layer bottom electrode.

MRAM is a type of non-volatile random access memory (NVRAM) that utilizes magnetic states and magnetic storage elements to store data. MRAMs can store data through a magnetic tunnel junction (MTJ) configuration, for example. A magnetic tunnel junction configuration includes two ferromagnetic plates separated by a thin insulator layer, with one of the plates being a permanent magnet and the second plate having a changeable magnetization direction. The plate with a permanent magnet may be referred to herein as a fixed plate, and the plate with a changeable magnetization direction may be referred to herein as a free plate. The MTJ configuration creates electron tunneling and the electrons can tunnel from one plate to the other. The amount of tunneling changes the resistance of the MTJ and the data can be stored in the MRAM using the changes in resistance.

For instance, the amount of electron tunneling (and current transfer) between the layers of an MRAM stack may be altered by changing the magnetization direction of the free plate. Specifically, the free plate(s) may have their magnetization direction changed (for example, using magnetic fields or polarized currents) to a same direction or opposite direction to the fixed plate. When the magnetization of the free plate and the fixed plate have different directions, the amount of electron tunneling between the layers is less and there is a higher resistance between the plates. When the magnetization of the free plate and the fixed plate are in a same direction, the amount of electron tunneling between the layers is higher and there is a lower resistance between the plates. In some instances, when there is a low resistance a logic 0 is stored and when there is a high resistance a logic 1 is stored.

Although a MTJ configuration is described above as having a single fixed plate, a single free plate, and a thin insulator separating the two, the MTJ configuration may include a plurality of magnetic layers (i.e., ferromagnetic plates) and insulator layers, with the insulator layers separating each fixed plate and free plate. For example, a MTJ configuration may include a fixed plate, a thin insulator, a free plate, another thin insulator, another fixed plate, another thin insulator, another free plate, and so on. These MTJ configurations may be referred to herein as MRAM stacks, as the MRAM may include one or more stacks of ferromagnetic plates and insulator layers. In some instances, the MRAM stack may be a component that is part of a larger pillar structure within a semiconductor and/or device. For example, the MRAM may be embedded between interconnect levels and may be within the back end of line (BEOL) portion of a semiconductor chip. These pillar structures may be discussed further herein, and may be referred to herein as MRAM pillar structures.

In some instances, either within an MRAM pillar structure or as part of another MRAM structure, the MRAM stack may be between a bottom electrode and a top electrode. This way, the two electrodes may have a direct connection (or at least a direct electrical connection) to the MRAM stack and the ferromagnetic plates.

Further, it may be beneficial to have a bottom electrode with multiple layers and multiple materials. For instance, the bottom electrode may be between the MRAM stack and other metal layers/components or contacts (discussed further herein). Because of this, the bottom electrode may also serve as a cap of sorts in order to prevent any material from the metal layer(s) migrating/diffusing to other portions of the MRAM structure, particularly during the formation process. Put differently, the bottom electrode may also serve as a diffusion barrier for the metal layer(s)/components. Materials such as tantalum nitride (TaN), ruthenium (Ru), etc. may be used as diffusion barriers due to their beneficial properties such as their high sticking coefficient, thermal stability, and adherence/adhesion to the metal layer(s)/components. A sticking coefficient, as referred to herein, may describe the likelihood of atoms/molecules sticking/absorbing to a surface. Therefore, a compound with a high sticking coefficient may be very likely to stick to a surface.

However, these preferred diffusion barrier materials may also cause issues when these materials are serving as bottom electrodes (particularly during the formation process of the bottom electrode and the MRAM structure), as the diffusion barrier material(s) may be very difficult to remove from the MRAM stack and/or other components of the MRAM structure if any of the diffusion barrier migrates, diffuses, redeposits, etc. For example, when an MRAM pillar structure is being formed, the bottom electrode and other components of the pillar may be patterned. However, the patterning may cause the patterned portions of the components to escape (for example, as a debris of sorts during the patterning/etching process) and land on/in other components, such as the MRAM stack. This process may be referred to herein as redepositing the material, as the escaped material is now redeposited on/in a different component. In some instances, the diffusion barrier material(s) may be very difficult to remove at least in part because of the non-volatility of the byproducts from etching the diffusion barrier which may make the barrier very difficult to remove (for example, as a gaseous species).

These diffusion barrier materials such as TaN, Ru, etc. may be very difficult to remove from where they were redeposited (for example, due to the properties that make these materials effective diffusion barriers (such as high sticking coefficient, good adherence/adhesion, etc.), along with the non-volatility of the diffusion barrier material(s)). In addition, the diffusion barrier material(s) (e.g., TaN, Ru, etc.) are also conductive. This may cause further issues if the diffusion barrier material is redeposited because not only is the diffusion barrier material difficult to remove, but it is also conductive and can cause shorts and other device performance issues. For example, if the diffusion barrier material were to be redeposited into the MRAM stack, the diffusion barrier material could disrupt the electron tunneling, magnetic fields, etc., which could affect the magnetic tunnel junction configuration and the functioning of the MRAM (and/or the device as a whole).

Therefore, to help prevent issues from redeposition of a diffusion barrier material, conventional MRAM structures may only deposit a very thin layer of the diffusion barrier material to serve as the cap for the metal layer(s) and then a different material such as titanium nitride (TiN), tungsten (W), a combination of the two materials, or another applicable material or combination of materials may serve as the primary bottom electrode. However, while having a thin layer of the diffusion barrier material may reduce the amount of material that can be redeposited during a patterning/etching step, the diffusion barrier material can still be redeposited, therefore device shorts and/or other device performance issues from redeposition of the diffusion barrier material may still occur.

SUMMARY

The present invention provides a magnetoresistive random access memory (MRAM) structure, a system, and a method of forming an MRAM structure. The MRAM structure may include a bottom electrode. The bottom electrode may include a diffusion barrier. The bottom electrode may further include a dielectric that surrounds one or more sidewalls of the diffusion barrier. The dielectric may protect the diffusion barrier from being etched and may prevent device shorts or other issues caused by redeposition of bits of the diffusion barrier due to etching. In some instances, the diffusion barrier may have a high sticking coefficient. The high sticking coefficient (as well as the adhesive properties) of a diffusion barrier may help effectively cap a metal component and prevent diffusion. In some instances, the diffusion barrier may include at least one of TaN and Ru. TaN and Ru may have beneficial diffusion barrier properties such as high sticking coefficient, thermal stability, and adherence/adhesion, which may increase the effectiveness of the diffusion barrier. In some instances, the MRAM structure may include an electrode layer. The electrode layer may be relatively easy to remove if it is redeposited, for instance, compared to the diffusion barrier, therefore redeposition of the electrode layer may not cause device shorts or other issues as the electrode layer can be removed from where it was redeposited. In some instances, the MRAM structure may include an MRAM stack, where the MRAM stack includes one or more stacks of ferromagnetic plates and insulator layers.

The system may include a magnetoresistive random access memory (MRAM) structure. The MRAM structure may include a bottom electrode. The bottom electrode may include a diffusion barrier. The bottom electrode may further include a dielectric that surrounds one or more sidewalls of the diffusion barrier. The MRAM structure may further include an MRAM stack. The MRAM structure may further include a top electrode. The dielectric that surrounds one or more sidewalls of the diffusion barrier may protect the diffusion barrier from being etched and may prevent device shorts or other issues caused by redeposition of bits of the diffusion barrier due to etching. In some instances, the diffusion barrier may have a high sticking coefficient. The high sticking coefficient (as well as the adhesive properties) of a diffusion barrier may help effectively cap a metal component and prevent diffusion. In some instances, the MRAM structure may include an electrode layer. The electrode layer may be relatively easy to remove if it is redeposited, for instance, compared to the diffusion barrier, therefore redeposition of the electrode layer may not cause device shorts or other issues as the electrode layer can be removed from where it was redeposited. In some instances, the diffusion barrier may include at least one of TaN and Ru. TaN and Ru may have beneficial diffusion barrier properties such as high sticking coefficient, thermal stability, and adherence/adhesion, which may increase the effectiveness of the diffusion barrier. In some instances, the system may include a metal component, where the metal component is capped by the diffusion barrier. The diffusion barrier capping the metal component may help prevent diffusion of the metal component to other components of the system. In some instances, the diffusion barrier has a width greater than or equal to the metal component. A diffusion barrier with a width greater than or equal to the metal component may more fully cap the metal component and increase the protection/prevention of diffusion of the metal component.

The method of forming a magnetoresistive random access memory (MRAM) structure may include depositing a first dielectric, where a metal component remains uncovered by the dielectric. The method may further include depositing a diffusion barrier on at least the metal component. The method may further include depositing an electrode layer on the first dielectric and the diffusion barrier, resulting in a bottom electrode comprising the electrode layer, the first dielectric, and the diffusion barrier. The dielectric may protect the diffusion barrier from being etched and may prevent device shorts or other issues caused by redeposition of bits of the diffusion barrier due to etching. In some instances, the first dielectric may surround sidewalls of the diffusion barrier. This may protect the exposed portions of the diffusion barrier and prevent redeposition. In some instances, the method may include forming an MRAM stack connected to the electrode layer and depositing a top electrode on the MRAM stack.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
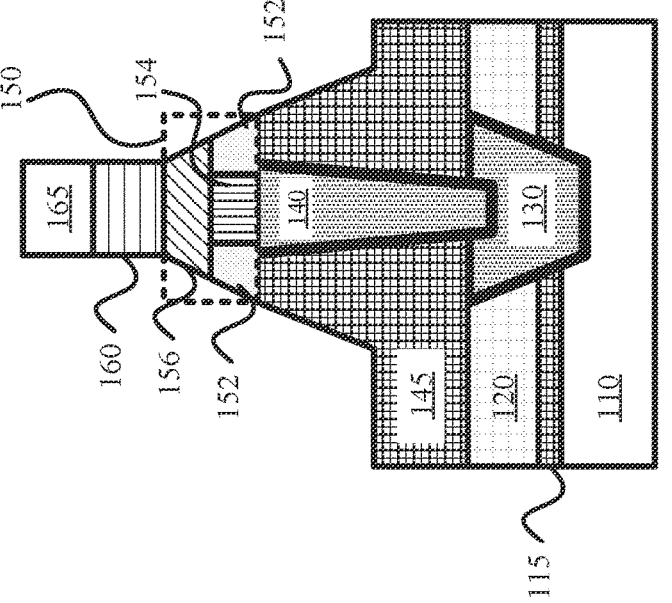
FIG. 1 depicts a schematic diagram of an example MRAM stack with a multi-component, multi-layer bottom electrode, according to some embodiments.
Figure 1:
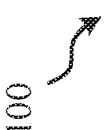

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to magnetoresistive random access memory (MRAM) and, more specifically, to protecting the conductive layer of the bottom electrode of the MRAM by utilizing a multi-component, multi-layer bottom electrode. While the present disclosure is not necessarily limited to such applications, various aspects of the disclosure may be appreciated through a discussion of various examples using this context.

Magnetoresistive random access memory (MRAM) has many advantages compared to other types of memory including a faster read/write speed, the ability to store data without power (i.e., non-volatile capabilities), no degradation of data over time, and a lower level of power consumption. Therefore, MRAMs are a desirable type of memory to utilize within a semiconductor chip and/or device.

However, as discussed above, conventional bottom electrodes within an MRAM may have redeposition issues, as diffusion barrier materials such as TaN, Ru, etc. may be very difficult to remove from where they were redeposited (such as from sidewalls of an MRAM stack). This may cause device issues such as shorts or other performance issues due to the conductive material of the diffusion barrier as well as its difficulty of removal.

Therefore, the present disclosure provides an MRAM structure, a system, and a method of forming a multi-component, multi-layer bottom electrode within the MRAM. The multi-component, multi-layer bottom electrode includes a layer of diffusion barrier material, a layer of a bottom electrode material (such as TiN, W, etc., discussed above), and a dielectric material that surrounds the sidewalls of the diffusion barrier material (i.e., the portions of the diffusion barrier material that would be exposed during a patterning or etching step). By surrounding the sidewalls/exposed portions of the diffusion barrier material with dielectric, the dielectric material may be redeposited onto other components during patterning/etching instead of the diffusion barrier material. The dielectric may be much easier to remove/clean after redeposition and may be much less likely to cause any damage or functional issues, even if it is not removed after redeposition, as the dielectric is not conductive (and thus likely will not cause shorts and the like).

In addition, because the diffusion barrier material is protected and is not exposed during the patterning process, the diffusion barrier material can be thicker (compared to conventional corresponding structures within MRAMs) and can therefore more effectively cap the metal layer(s) and prevent metal migration from the metal layer. Thickness and thinness of the diffusion barrier, as discussed herein, may refer to the height of the diffusion barrier (for example, when looking at a cross sectional view such as depicted in FIGS. 1-11). In some instances, the diffusion barrier material may have a thickness between 10 nanometers (nm)-50 nm. As discussed above, conventional MRAMs may have extremely thin diffusion barrier material layers due to the harm that redeposition of the diffusion barrier material can cause. However, thicker diffusion barrier material (e.g., 10-50 nm) may be desired for improved/more effective capping. Further, it may be difficult to control uniformity of the diffusion barrier material layer across the wafer/MRAM structure when the diffusion barrier material is thin. Therefore, a thicker diffusion barrier material protected by dielectric (for example, with sidewalls surrounded by dielectric) may improve/increase effectiveness of the capping of the metal layers, increase/improve uniformity of the diffusion barrier material layer (as uniformity may be easier to control with a thicker layer), and help prevent/mitigate damage or functional issues from redeposition.

Figure 11:
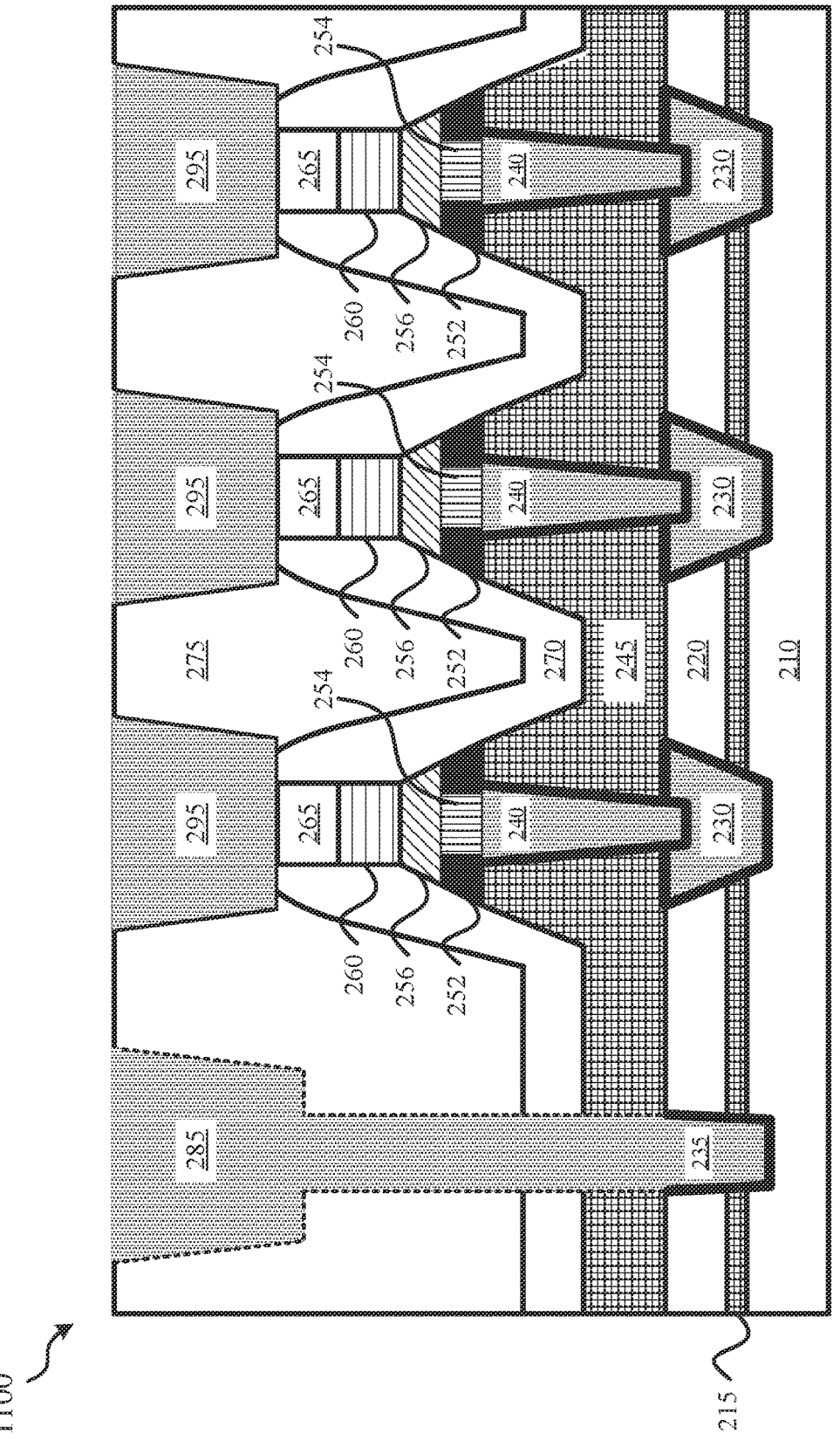
FIG. 11 depicts a schematic diagram of a fully formed MRAM structure with a multi-component, multi-layer bottom electrode, according to some embodiments.

Referring now to FIG. 1, a schematic diagram of a cross-sectional view of an example MRAM pillar 100 with a multi-component, multi-layer bottom electrode 150 is depicted, according to some embodiments. Although not depicted, for simplicity sake, MRAM pillar 100 may also include additional layers of dielectric (such as depicted in FIG. 11, for example) or other components. MRAM pillar 100 is an exemplary pillar structure (that is part of a semiconductor chip, for example) that includes an MRAM.

For instance, as depicted in FIG. 1, MRAM pillar 100 includes metal components 130 and 140. Metal components 130 and 140 may be made of metal materials such as copper (Cu), cobalt (Co), ruthenium (Ru), tungsten (W), etc. In some instances, metal components 130 and 140 may be contacts, interconnects, etc. that connect and/or transfer current between various components of the semiconductor chip. For example, metal components 130 and 140 may be contacts and/or interconnects connecting transistor(s) (such as complementary metal-oxide-semiconductor (CMOS) transistor(s)) to MRAM(s). MRAM pillar 100 also includes various dielectric layers 110, 115, 120, and 145.

In some instances, dielectric layers 110 and 120 may be dielectric materials such as tetraethylorthosilicate (TEOS), an oxide dielectric material, and/or any other applicable low-k dielectric or ultra low-k (ULK) dielectric. In some instances, dielectrics 110 and 120 may be the same material. In some instances, dielectrics 110 and 120 may be different materials. Dielectric 120 may serve as an inter-layer dielectric (ILD).

In some instances, dielectric layers 115 and 145 may be dielectric materials such as SiN, SiCN(H), TEOS, NBLOK™ (a nitrogen doped SiC), or any other applicable dielectric material. In some instances, dielectric layers 115 and 145 may serve as cap layers. These cap layers may be layers that help protect other components and layers (including other dielectric layers such as dielectrics 110 and 120) during patterning processes such as chemical-mechanical polishing/planarization (CMP), and may also help seal off, or cap, other more porous dielectric layers (which, in some instances, may be dielectric layers 110 and/or 120). In some instances, dielectric 115 and dielectric 145 may be the same material. In some instances, dielectrics 115 and 145 may be different materials.

MRAM pillar 100 also includes multi-component, multi-layer bottom electrode 150, MRAM stack 160, and top electrode 165. As discussed herein, MRAM stacks, such as MRAM stack 160, may include one or more stacks of ferromagnetic plates and insulator layers, with the insulator layers separating the fixed plate(s) from the free plate(s). For example, an MRAM stack 160 may include a fixed plate, an insulator layer, and a free plate, with the insulator layer between the fixed plate and the free plate. In another example, an MRAM stack 160 may include a fixed plate, an insulator layer, a free plate, another insulator layer, another fixed plate, another insulator layer, another free plate, and so on. The MRAM stack 160 may be in a MTJ configuration, in some instances. Top electrode 160 may be an electrode material such as niobium (Nb), niobium nitride (NbN), tungsten (W), tungsten nitride (WN), tantalum (Ta), tantalum nitride (TaN), titanium (Ti), titanium nitride (TiN), ruthenium (Ru), molybdenum (Mo), chromium (Cr), vanadium (V), palladium (Pd), platinum (Pt), rhodium (Rh), scandium (Sc), aluminum (Al), other high melting point metals or conductive metal nitrides, and/or other electrode material(s).

As discussed herein, a bottom electrode in an MRAM pillar (such as bottom electrode 150) may serve as both a bottom electrode and as a diffusion barrier/cap to prevent migration/diffusion of metal layers/components (such as metal component 140) and may include multiple layers/materials in order to achieve both functions. Therefore, bottom electrode 150 includes a bottom layer 154 that functions as a diffusion barrier (referred to herein as diffusion barrier 154) as well as a top layer 156 (referred to herein as electrode layer 156) that functions as an electrode layer. While diffusion barrier 154 is referred to as functioning as a diffusion barrier, diffusion barrier 154 may also function as an electrode material. However, as discussed herein, diffusion barrier 154 may be difficult to remove from other components of the MRAM pillar in instances of redeposition, therefore it may not be desirable for the entirety of bottom electrode 150 to be a diffusion barrier 154. Thus, bottom electrode 150 also includes electrode layer 156 that has electrode capabilities, while also being made of a material that is easier to remove and less likely to cause harm in the case of redeposition.

In some instances, electrode layer 156 may include TiN, W, a combination of TiN and W, and/or any other applicable metal material (for instance, that may be easy to remove in cases of redeposition). In some instances, diffusion barrier 154 may include TaN, Ru, or any other applicable metal material (for instance, that may effectively cap/prevent other metal components from diffusion). In some instances, diffusion barrier 154 may have a width less than or equal to the surface width of the metal component 140 (i.e., the width of the metal component 140 at the area covered/capped by the diffusion barrier 154). Although, in this instance, the diffusion barrier 154 may not fully cover the metal component 140, the diffusion barrier 154 may be thick enough (for example, having a thickness of 10 nm-50 nm) that it restricts diffusion of the metal component 140 (for example, copper diffusion, when the metal component 140 is made of copper) in downstream processing. Therefore, in this instance, it may not be needed to have a diffusion barrier 154 that fully covers the metal component 140. In some instances, diffusion barrier 154 may have a width greater than or equal to the surface width of the metal component 140 in order to fully cap/cover the metal component 140. Put differently, the diffusion barrier 154 may have a shape/size such that it completely covers the top exposed portion of the metal component 140, therefore fully capping the metal component 140.

Bottom electrode 150 also includes dielectric 152. Dielectric 152 may surround the sidewalls of diffusion barrier 154 and may protect diffusion barrier 154 from being patterned/etched during the formation process of the MRAM pillar 100. This way, only the dielectric 152 and the electrode layer 156 may be redeposited during patterning and the diffusion barrier 154 is protected from redeposition. As discussed herein, both electrode layer 156 and dielectric 152 may be much easier to remove from other components of the MRAM pillar 100 (such as the MRAM stack 160) compared to the diffusion barrier 154, therefore device shorts and other issues caused by redeposition may be much less likely as a metal conductive material is not permanently embedded into the MRAM stack 160, for example. Dielectric 152 may be insulator materials such as aluminum oxide (AlOx), hafnium oxide (HfOx), silicon oxide (SiOx), silicon nitride (SiN), silicon carbonitride (SiCN), or any other applicable dielectric material.

Although not depicted, MRAM pillar 100 may include additional components such as lower level interconnect metal layers (for example, middle of line (MOL) or back end of line (BEOL) interconnect metal layers) or any other component that may be included in an MRAM pillar and/or a semiconductor device with an MRAM.

Referring now to FIGS. 2-11, FIGS. 2-10 may depict intermediate steps in the process of forming MRAM structure 1100. FIG. 11 depicts the fully formed MRAM structure 1100. Although FIGS. 2-10 are discussed in relation to MRAM structure 1100 (FIG. 11), the similar steps may be used to form MRAM pillar 100 (FIG. 1), in some instances.

Figure 2:
FIG. 2 depicts a schematic diagram of a first intermediate step in a process of forming an MRAM structure with a multi-component, multi-layer bottom electrode, according to some embodiments.
Figure 2:
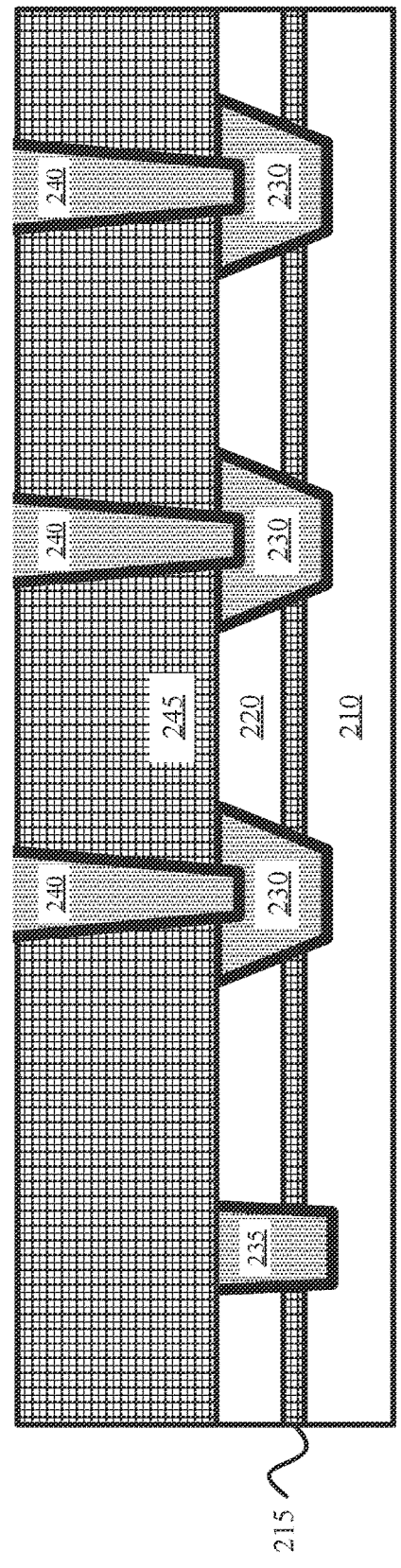

Referring to FIG. 2, a schematic diagram of a first intermediate step 200 in a process of forming an MRAM structure with a multi-component, multi-layer bottom electrode is depicted, according to some embodiments. An MRAM structure, as referred to herein, may refer to a structure on a semiconductor chip, for example, that includes on or more MRAMs. As discussed and depicted herein, an MRAM structure may also include additional components such as dielectric layers, metal contacts, top and bottom electrodes, etc.

In intermediate step 200, the components of the MRAM structure that are below the bottom electrode and the MRAM stack (for example, the MTJ configuration) are formed. Below, as referred to herein, refers to a component and/or portion of a structure that was formed before another component and/or that appears below another component when looking at a cross-sectional view such as the view depicted in FIGS. 1-11. For instance, metal layer 230 is below metal layer 240, dielectric 210 is below dielectric 215, etc.

Intermediate step 200 depicts components of the MRAM structure including dielectric layers 210, 215, 220, and 245 as well as metal components 230, 240, and 235. In some instances, dielectric layers 210, 215, 220, and 245 correspond to and/or are similar to dielectric layers 110, 115, 120, and 145 from FIG. 1. In some instances, metal components 230 and 240 correspond to and/or are similar to metal components 130 and 140 from FIG. 1. In FIG. 2, each metal component 230 (and its corresponding metal component 240) may be part of an MRAM pillar. Therefore, FIG. 2 may include three partially formed MRAM pillars. Metal component 235 may correspond to a metal contact (formed in later steps of the formation process of the MRAM structure) that may help connect and/or serve as a contact between various components of the semiconductor chip.

Figure 3:
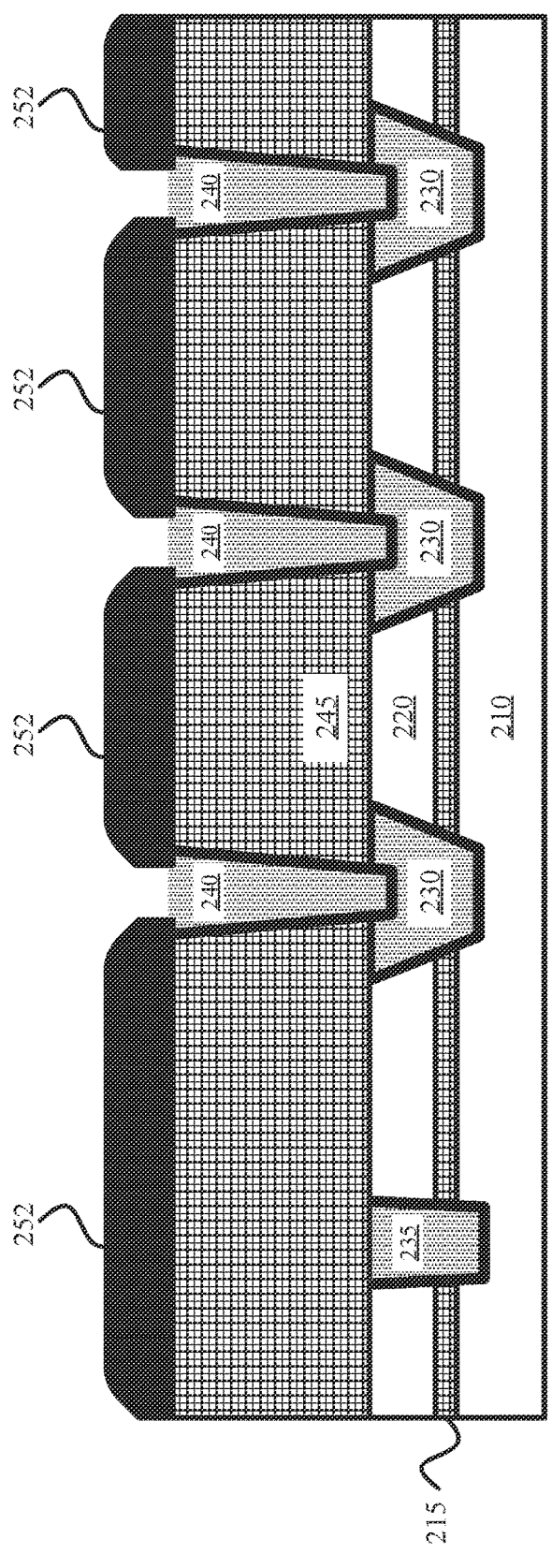
FIG. 3 depicts a schematic diagram of a second intermediate step in a process of forming an MRAM structure with a multi-component, multi-layer bottom electrode, according to some embodiments.

Referring now to FIG. 3, a schematic diagram of a second intermediate step 300 in a process of forming an MRAM structure with a multi-component, multi-layer bottom electrode is depicted, according to some embodiments. In intermediate step 300, dielectric 252 is selectively deposited above dielectric 245. Above, as used herein, may refer to a component, portion of a component, layer, etc. that was filled after another component, portion of a component, layer, etc. and/or that appears on top of another component, portion of a component, layer, etc. when looking at a cross-sectional view such as the view depicted in FIGS. 1-11. For instance, dielectric 252 is above dielectric 245, dielectric 220 is above dielectrics 210 and 215, etc.

In some instances, dielectric 252 may deposited using a selective deposition technique where the dielectric 252 is selectively deposited on top of dielectric 245 but not onto metal component 240. In some instances, dielectric 252 may be selectively deposited on top of dielectric 245, however there may be a minimal overlap onto metal component 240 (for example, metal component 240 may remain primarily exposed, however small portions of metal component 240 (for instance, the portions closest to dielectric 245) may be covered by dielectric 252). In some instances, dielectric 252 corresponds to and/or is similar to dielectric 152 (FIG. 1).

Figure 4:
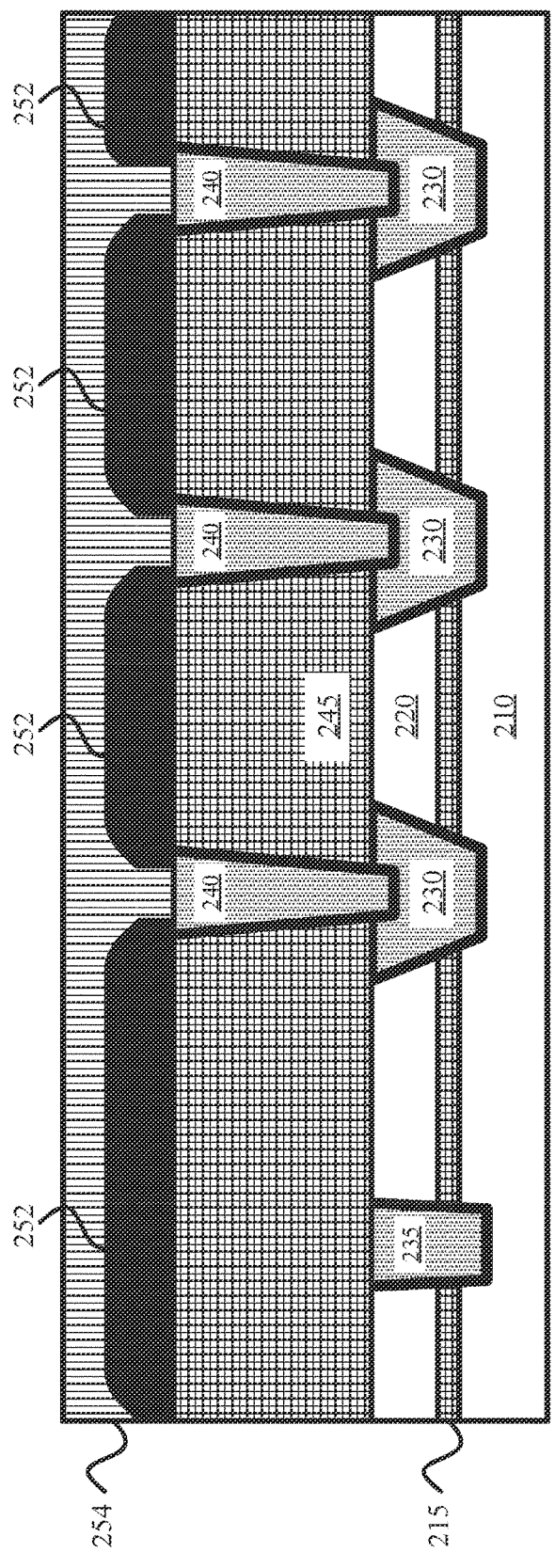
FIG. 4 depicts a schematic diagram of a third intermediate step in a process of forming an MRAM structure with a multi-component, multi-layer bottom electrode, according to some embodiments.

Referring to FIG. 4, a schematic diagram of a third intermediate step 400 in a process of forming an MRAM structure with a multi-component, multi-layer bottom electrode is depicted, according to some embodiments. In intermediate step 400, diffusion barrier 254 is deposited on top of the dielectric 252 and the metal component 240. Diffusion barrier 254 may be deposited using methods such as atomic layer deposition (ALD), chemical vapor deposition (CVD), laser induced chemical vapor deposition (LCVD), and/or any other applicable deposition technique. In some instances, diffusion barrier 254 corresponds to and/or is similar to diffusion barrier 154 (FIG. 1).

Figure 5:
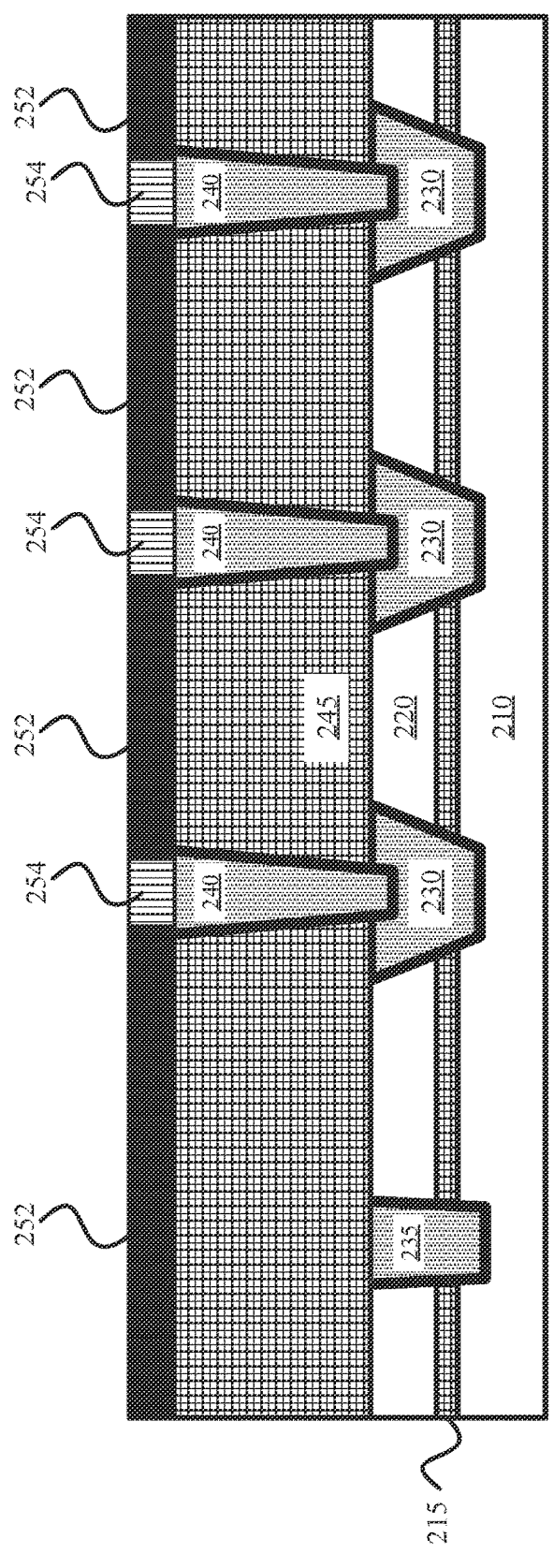
FIG. 5 depicts a schematic diagram of a fourth intermediate step in a process of forming an MRAM structure with a multi-component, multi-layer bottom electrode, according to some embodiments.

Referring to FIG. 5, a schematic diagram of a fourth intermediate step 500 in a process of forming an MRAM structure with a multi-component, multi-layer bottom electrode is depicted, according to some embodiments. In intermediate step 500, excess material from the depositions of the dielectric 252 and the diffusion barrier 254 are removed. In some instances, the excess material may be any deposited material (i.e., dielectric 252 and diffusion barrier 254) that is above a desired thickness of the diffusion barrier 254. As discussed herein, the diffusion barrier 254 may desire to have a thickness that can effectively cap the metal component(s) 240 and can maintain a uniformity in dimension/thickness (compared to diffusion barriers that are so thin it is difficult to maintain and control uniformity). In some instances, the excess material may be removed (and then the remaining material (e.g., dielectric 252 and diffusion barrier 254) smoothed/polished) through chemical mechanical planarization (CMP). Once the excess material is removed, dielectric 252 may surround the sidewalls of the diffusion barriers 254. This way, the sidewalls of the diffusion barriers 254 are protected and are not exposed to any patterning/etching.

Figure 6:
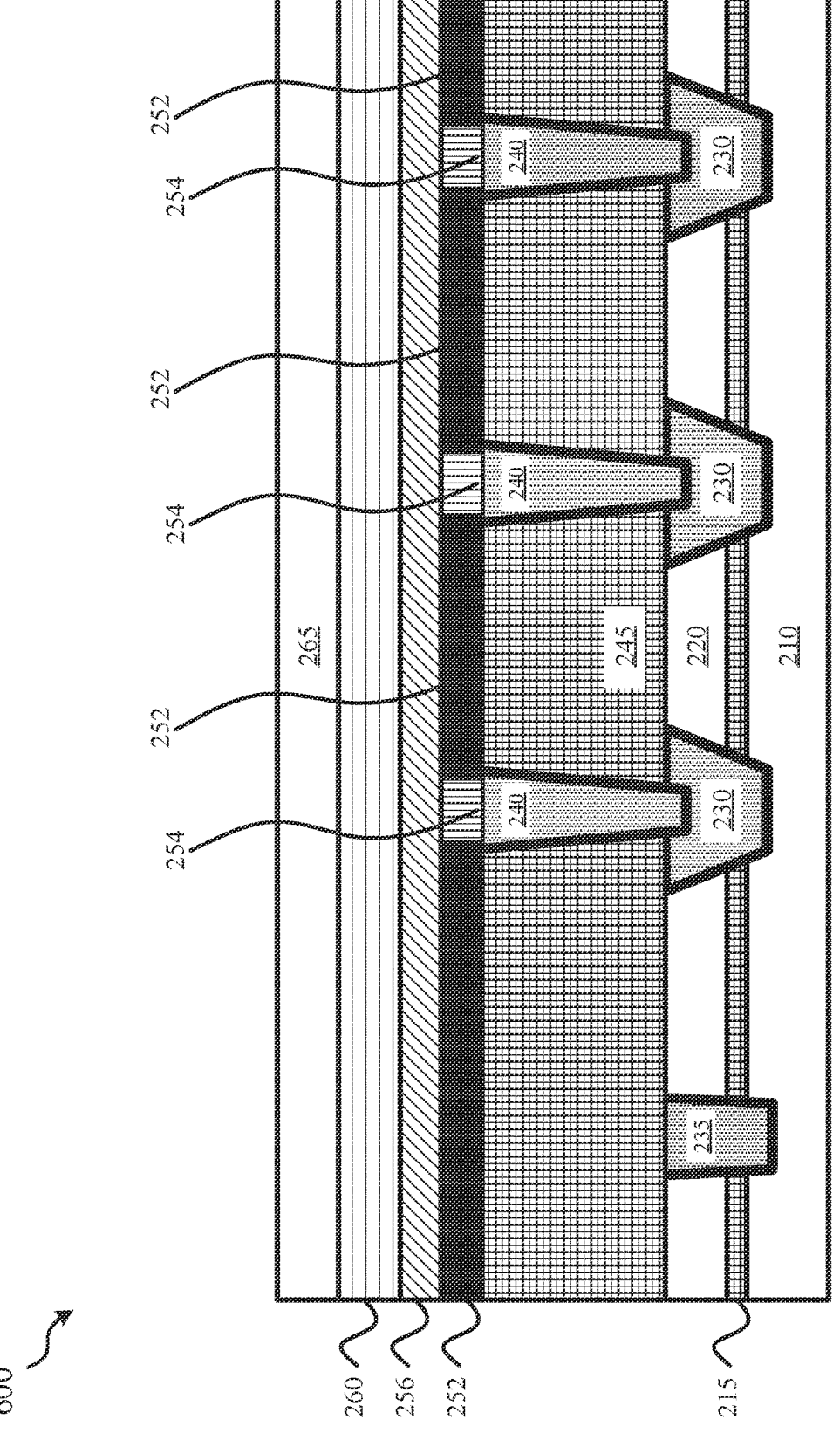
FIG. 6 depicts a schematic diagram of a fifth intermediate step in a process of forming an MRAM structure with a multi-component, multi-layer bottom electrode, according to some embodiments.

Referring to FIG. 6, a schematic diagram of a fifth intermediate step 600 in a process of forming an MRAM structure with a multi-component, multi-layer bottom electrode is depicted, according to some embodiments. In intermediate step 600, the remaining layers/components of the MRAM structure may be deposited. In this instance, this includes electrode layer 256, MRAM stack 260, and top electrode 265. These layers/components may be deposited using methods such as ALD, CVD, LCVD, and/or any other applicable deposition technique.

Figure 7:
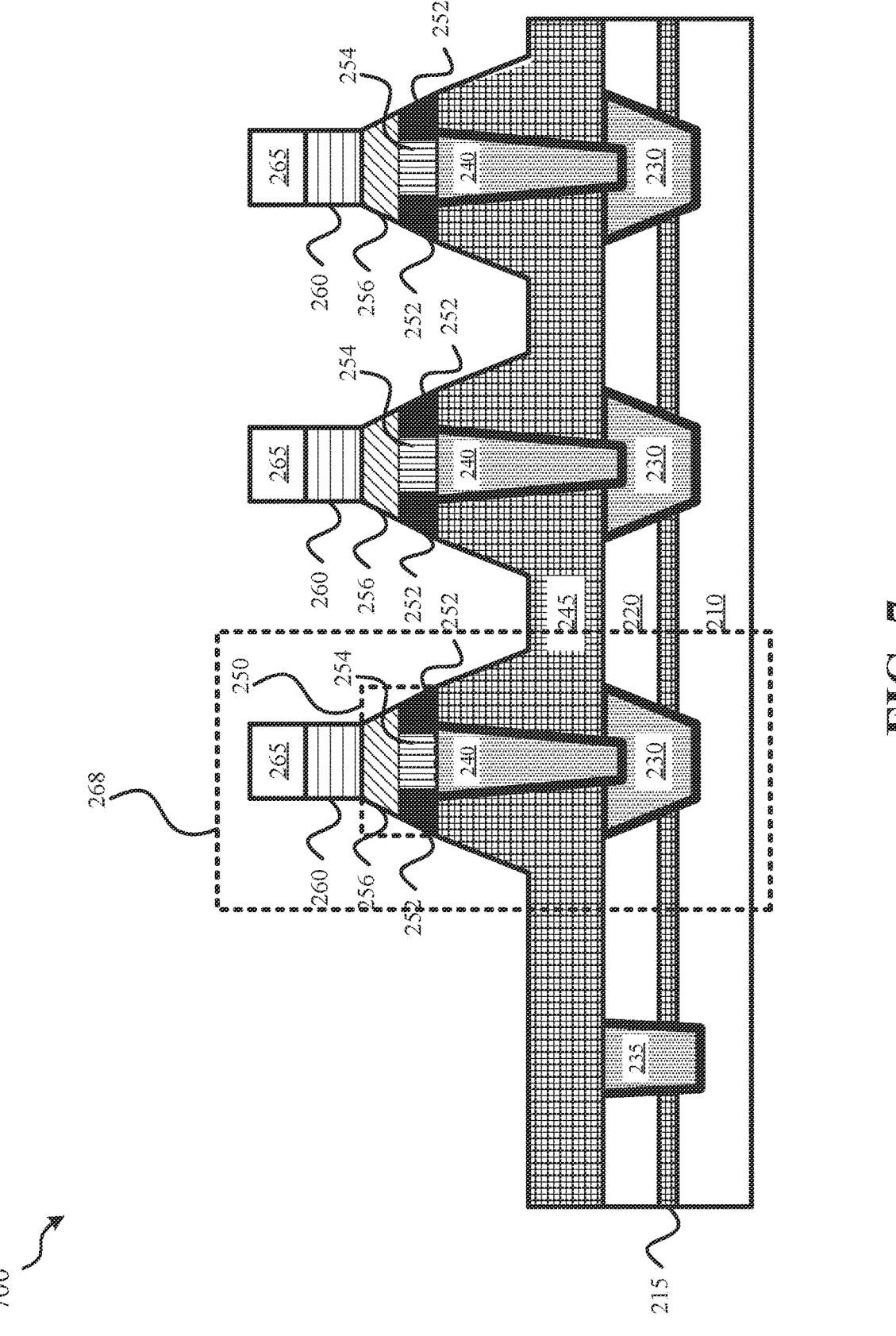
FIG. 7 depicts a schematic diagram of a sixth intermediate step in a process of forming an MRAM structure with a multi-component, multi-layer bottom electrode, according to some embodiments.

Referring now to FIG. 7, a schematic diagram of a sixth intermediate step 700 in a process of forming an MRAM structure with a multi-component, multi-layer bottom electrode is depicted, according to some embodiments. Intermediate step 700 includes forming/shaping the various components into the pillar/pedestal shape depicted in FIG. 7. Although the MRAM pillars are depicted in a particular shape, any other applicable shape/form may be used. This formation/shaping may be referred to herein as pillar patterning. In some instances, top electrode 265 may be formed/shaped in one patterning step and MRAM stack 260, dielectric 252, and electrode layer 256 may be formed/shaped in another patterning step. For example, a first patterning step may include using RIE to pattern the top electrode 265. In this example, a second patterning step may include patterning the MRAM stack 260 and the bottom electrode 250 (including the dielectric 252 and the electrode layer 256) using ion beam etching (IBE) process(es). In some instances, top electrode 265 may be formed/shaped in a first patterning step, MRAM stack 260 may be formed/shaped in a second patterning step, and the bottom electrode 250 (including dielectric 252 and electrode layer 256) may be formed/shaped in a third patterning step. In some instances, dielectric 245 may be formed/shaped in the same/similar patterning step as dielectric 252 and electrode layer 256. In some instances, dielectric 245 may be formed/shaped in another patterning step separate from the other components/layers. Pillar patterning methods such as reactive ion etching (RIE), ion beam etching (IBE), etc. may be used for the patterning step(s), in some instances.

A pillar, as referred to herein, may be a set of components that, together, are in a pillar shape, the set of components including an MRAM stack and, in some instances, one or more other additional components. The additional components may include a top and bottom electrode (for instance, with an electrode on either side of the MRAM stack), and other metal components (such as contacts, interconnects, etc.). A pillar shape, as referred to herein, may be a tall, narrow column shape. For example, as depicted in FIG. 7, pillar 268 is an MRAM pillar having a slight pillar- (or column-) like shape, as the stack of components (for example, when viewed together) have a tall, narrow shape. Although only one pillar 268 and one bottom electrode 250 are specifically denoted in FIG. 7, FIG. 7 depicts three MRAM pillars, each MRAM pillar including a top electrode 265, MRAM stack 260, a bottom electrode 250 (including an electrode layer 256, a diffusion barrier 254, and a dielectric 252), metal components 240 and 230, and, in some instances, the corresponding dielectrics 210, 215, 220, and 245. These components are example components of an MRAM pillar 268, however an MRAM pillar 268 may include any applicable components, dielectrics, etc.

During the pillar patterning process, it is possible that portions of electrode layer 256 and/or dielectric 252 are redeposited into the MRAM stack 260, for example. Redepositing, as discussed herein, refers to the situation in which the components are patterned, however the patterning causes portions of the components to escape and land on/in other components (for example, as a debris of sorts during the patterning/etching process). For example, if RIE is being performed on electrode layer 256 and/or dielectric 252, small portions of the electrode layer 256 and/or dielectric 252 that are being removed through the RIE may fly around and land in MRAM stack 260. The MRAM stack 260 is particularly susceptible to harm from redeposition as the sidewalls of the MRAM stack 260 are exposed (as depicted in FIG. 7) and the MRAM stack 260 is made up of stacks of ferromagnetic plates and insulator layers (which, when compared to a solid layer of material for example, have more space for pieces of components to get lodged into the stack). If the diffusion barrier 254 was exposed to the patterning/ etching, diffusion barrier 254 may have become lodged/ redeposited in MRAM stack 260, and may have been extremely difficult to remove from MRAM stack 260, there- fore potentially causing shorts and other functional issues for the MRAM stack 260. However, as depicted in FIG. 7, diffusion barrier 254 is protected from patterning/etching by dielectric 252. Therefore, diffusion barrier 254 is not exposed to patterning/etching, and instead only the dielectric 252 and the electrode layer 256 are exposed. As discussed herein, both the electrode layer 256 and the dielectric 252 are relatively easy to remove/clean from the MRAM stack 260, especially when compared to the diffusion barrier 254. Therefore, any debris that is redeposited from the patterning/ etching of the electrode layer 256 and the dielectric 252 may be easier to remove from the MRAM stack 260 and may not cause issues in the functioning of the MRAM stack 260. Diffusion barrier 254 may also be conductive, which may cause the shorts and/or other functional issues for the MRAM stack 260 if the diffusion barrier 254 were to be redeposited. However, dielectric 252 may not be conductive and may instead be an insulator, therefore, redeposition of the dielectric 252 may not cause the shorts and/or other functional issues for the MRAM stack 260 due to the lack of conduction of the dielectric 252.

In some instances, intermediate step 700 may also include performing cleanup etch(es) to remove any redeposited material (for example, the electrode layer 256 and the dielectric 252) from the MRAM stack 260 and/or any other components. A cleanup etch, in some instances, may be a gentle form of an etch. For example, a cleanup etch may be an IBE process with low energy (for example, less than 300 volts) and a high angle (for example, greater than 60 degrees). In some instances, other IBE processes, for example the IBE process(es) utilized during pillar pattern- ing, may use higher energy and a lower angle compared to the cleanup etch. In some instances, a cleanup etch may be performed after each layer is patterned. For example, each layer (e.g., top electrode 265, MRAM stack 260, electrode layer 256, dielectric 253, and dielectric 245) may be pat- terned separately, and a cleanup etch may occur after each patterning (or at least after the electrode layer 256 patterning and the dielectric 252 patterning). In some instances, a cleanup etch may be performed after the pillar patterning is complete. For example, each layer may be patterned together, and once all the patterning is complete and the pillars are formed, a cleanup etch may be performed to clean and remove any material that was redeposited (or at least redeposited in/on the MRAM stack 260). This way, the redeposited material does not remain embedded in the MRAM stack 260. Further, even if the dielectric 252 was redeposited and not able to be removed, it is still much less likely to cause shorts and other device performance issues as the dielectric is not conductive.

Figure 8:
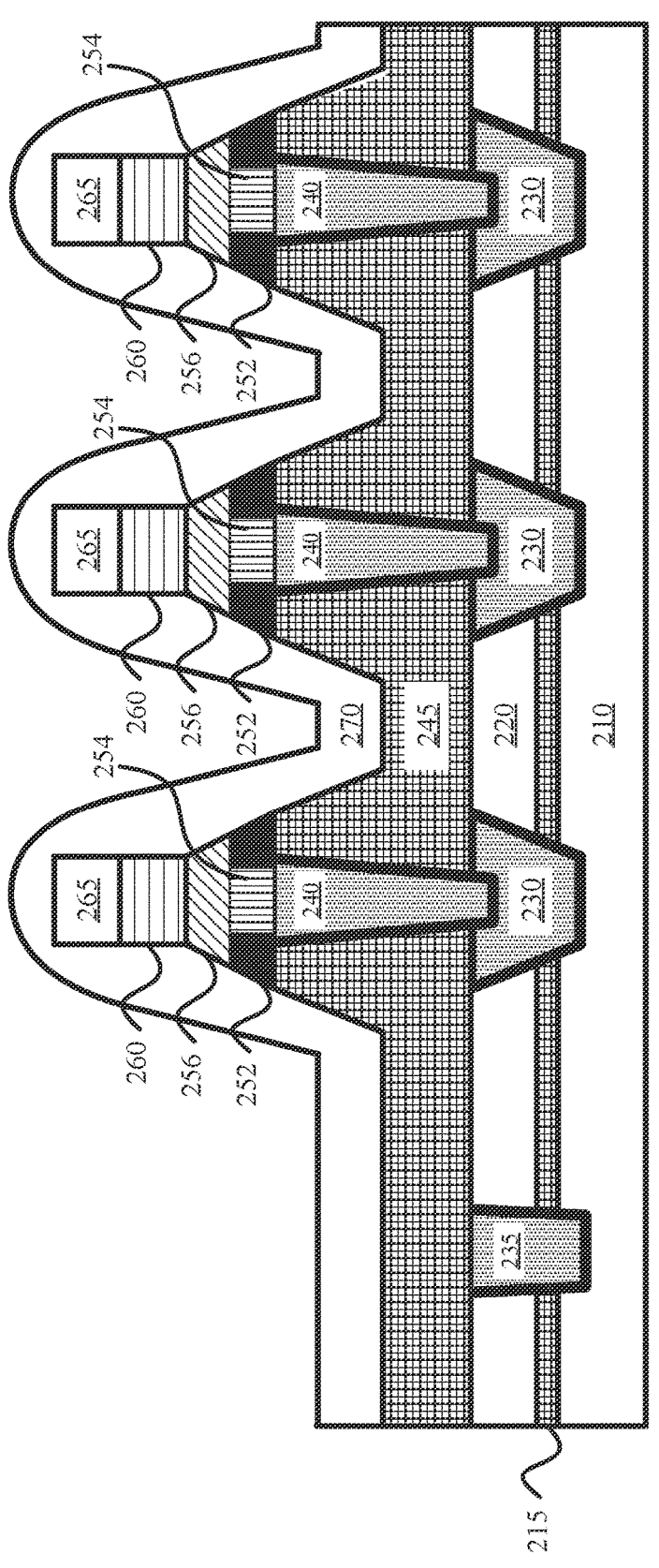
FIG. 8 depicts a schematic diagram of a seventh intermediate step in a process of forming an MRAM structure with a multi-component, multi-layer bottom electrode, according to some embodiments.

Referring to FIG. 8, a schematic diagram of a seventh intermediate step 800 in a process of forming an MRAM structure with a multi-component, multi-layer bottom elec- trode is depicted, according to some embodiments. Intermediate step 800 includes depositing dielectric 270 to encap- sulate MRAM stack 260. In some instances, as depicted in FIG. 8, the exposed portions of the pillars (for example, the bottom electrodes (with the electrode layer 256, diffusion barrier 254, and dielectric 252), the MRAM stacks 260, and the top electrodes 265) are all encapsulated. Encapsulating at least the MRAM stack 260 helps protect the MRAM stack 260 and prevent other components of the MRAM structure, the semiconductor device, etc. from affecting the MRAM stack 260 and the magnetic tunnel junction. In some instances, dielectric 270 is a more dense dielectric (for example, compared to dielectrics 210 and 220) in order to better protect and provide encapsulation for the MRAM stack 260. In some instances, dielectric 270 is a material such as SiN, SiCN(H), TEOS, or any other applicable dielectric. Dielectric 270 may be the same as dielectric 245 and/or dielectric 215 in some instances. Dielectric 270 may be referred to herein as encapsulating dielectric 270.

Figure 9:
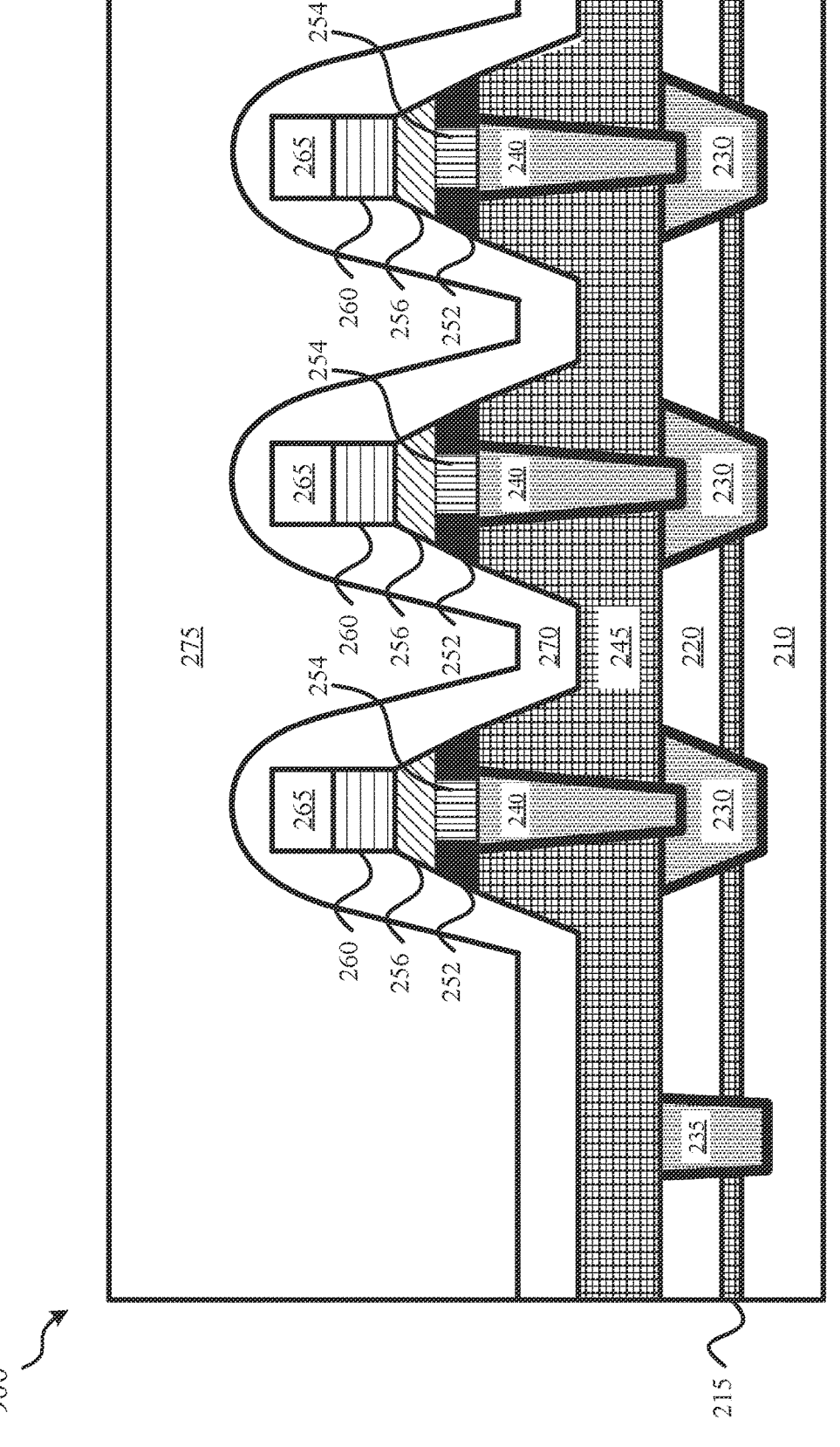
FIG. 9 depicts a schematic diagram of an eighth intermediate step in a process of forming an MRAM structure with a multi-component, multi-layer bottom electrode, according to some embodiments.

Referring to FIG. 9, a schematic diagram of an eighth intermediate step 900 in a process of forming an MRAM structure with a multi-component, multi-layer bottom elec- trode is depicted, according to some embodiments. Interme- diate step 900 includes depositing dielectric 275 on encap- sulating dielectric 270. In some instances, enough dielectric 275 may need to be deposited to be able to form vias (which will later be filled with material and form contacts (dis- cussed further herein)) above the top electrodes 265. In some instances, dielectric 275 is an ILD. In some instances, dielectric 275 is the same/similar material(s) as dielectric 220.

Figure 10:
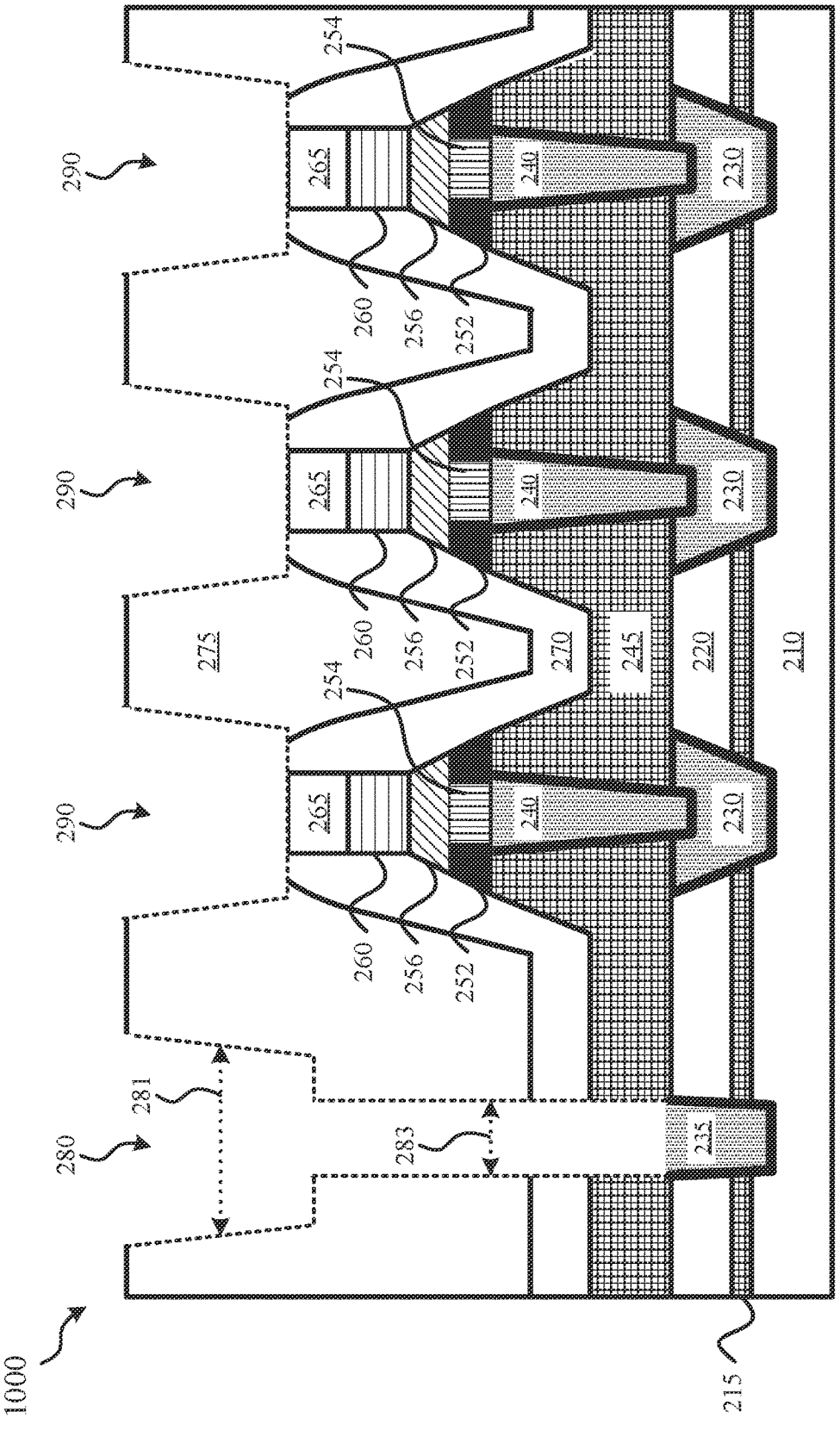
FIG. 10 depicts a schematic diagram of a ninth intermediate step in a process of forming an MRAM structure with a multi-component, multi-layer bottom electrode, according to some embodiments.

Referring to FIG. 10, a schematic diagram of a ninth intermediate step 1000 in a process of forming an MRAM structure with a multi-component, multi-layer bottom elec- trode is depicted, according to some embodiments. Interme- diate step 1000 includes patterning openings 290 (also referred to herein as vias) in the dielectric 275 and the encapsulating dielectric 270. The patterning may create openings 290 up to the top electrodes 265, such that a metal fill in the openings 290 would be directly connected to and/or electrically connected to the top electrodes 265.

In some instances, as depicted in FIG. 10, in addition to patterning the openings 290, an opening 280 may be pat- terned through the dielectric 275, the encapsulating dielec- tric 270, and dielectric 245. This opening 280 may extend to metal component 235. In some instances, opening 280 may be created in a same/similar shape and size to openings 290 (and at a same/similar time as openings 290), and then the opening 280 may be extended down to the metal component 235. In some instances, as depicted in FIG. 10, a top portion of the opening 280 (i.e., a portion of the opening farther away from the metal contact 235) may have a width 281 greater than the width 283 at a bottom portion of the opening (i.e., a portion of the opening closer to the metal contact 235). The openings 280 and 290 may be patterned using methods such as reactive ion etching (RIE), ion beam etching (IBE), etc.

Referring to FIG. 11, a schematic diagram of a fully formed MRAM structure 1100 with a multi-component, multi-layer bottom electrode is depicted, according to some embodiments. In fully formed MRAM structure 1100, the openings 280 and 290 (FIG. 10) have been filled with a metal material (such as Cu, Co, Ru, W, or any other applicable material). In some instances, this metal fill may include a metal deposition and planarization (for example, using CMP). By filling the openings 280 and 290 with metal, metal contacts 285 and 295 (respectively) are formed. Con- tacts 295 may provide a contact/connection between top electrodes 265 and other components of a semiconductor chip/device. In some instances, as depicted in FIG. 11, a contact 285 between metal component 235 and other components of a semiconductor chip/device (not depicted) may be formed as a part of MRAM structure 1100.

In some instances, an MRAM structure, such as MRAM structure 1100, may not include metal contact 285, and the MRAM structure 1100 may only include the MRAM pillars (with metal contacts 230, 240, and 295; a bottom electrode (with diffusion barrier 254, dielectric 252, and electrode layer 256); an MRAM stack 260, and a top electrode 265) and surrounding dielectrics (210, 215, 220, 245, 270, and 275). In some instances, an additional MRAM pillar may be formed instead of the metal contact 285.

Figure 12:
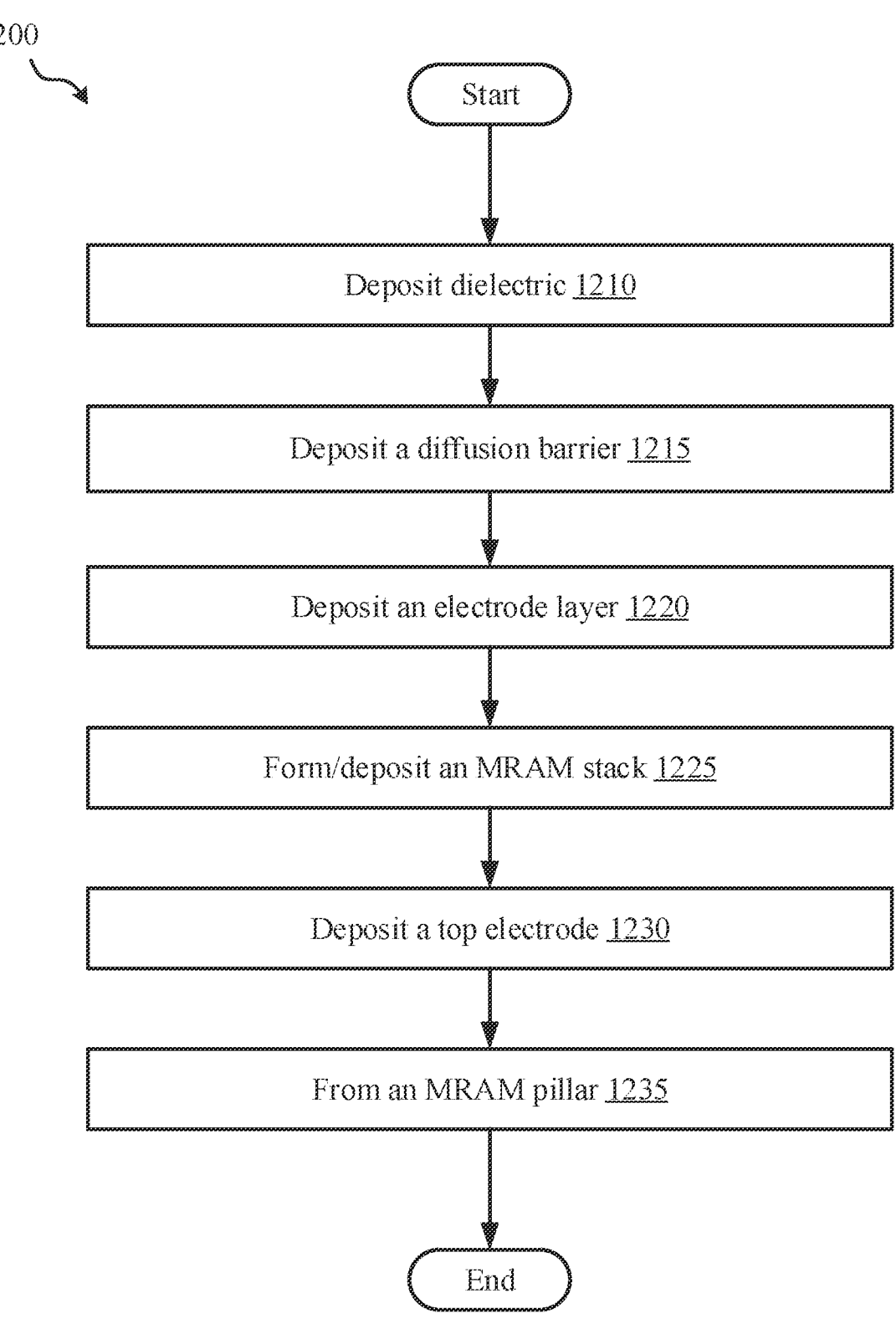
FIG. 12 depicts a flowchart of an exemplary method of forming an MRAM structure with a multi-component, multi-layer bottom electrode, according to some embodiments.

Referring now to FIG. 12, a flowchart of an exemplary method 1200 of forming an MRAM structure with a multi-component, multi-layer bottom electrode is depicted, according to some embodiments. Method 1200 includes operation 1210 to deposit dielectric. In some instances, the dielectric is deposited on a structure/components, including at least a metal component. For example, the dielectric may be deposited on a structure such as depicted in FIG. 2. In some instances, the dielectric may be deposited such that the metal component remains uncovered by the dielectric. For example, operation 1210 may correspond to intermediate step 300 (FIG. 3) and the dielectric may be deposited through selective deposition, as depicted in FIG. 3.

Method 1200 further includes operation 1215 to deposit a diffusion barrier. In some instances, the diffusion barrier is deposited at least on top of the exposed metal component, as the diffusion barrier may cap the metal component and help prevent diffusion of the metal component into/onto other components of the semiconductor device. The diffusion barrier may be deposited such that the dielectric (deposited in operation 1210) surrounds one or more sidewalls of the diffusion barrier. In some instances, the dielectric may surround all sidewalls of the diffusion barrier. In some instances, operation 1215 corresponds to intermediate step 400 (FIG. 4).

Method 1200 further includes operation 1220 to deposit an electrode layer. The electrode layer may be deposited on both the dielectric and the diffusion barrier, in some instances. In some instances, operation 1220 corresponds to intermediate step 600 (FIG. 6), and specifically, the deposition of electrode layer 256 from FIG. 6. In some instances, as discussed herein, prior to depositing any electrode layer, the excess material from the depositions of the dielectric and the diffusion barrier may be removed and/or polished, such as discussed in intermediate step 500 and depicted in FIG. 5. In some instances, any excess material may be removed/polished after each deposition step. For example, after the dielectric is deposited, any excess material may be removed and the exposed top layer may be polished in order to create even layer(s) of dielectric. Then, in this example, after the diffusion barrier is deposited, a second removal and polishing may be executed in order to remove excess material and even out the diffusion barrier layer.

In some instances, operations 1210-1220 may be a method of forming a bottom electrode that is part of an MRAM structure, and method 1200 may end after the bottom electrode is formed. In some instances, as depicted in FIG. 12, method 1200 may include additional operations to form an MRAM structure.

For instance, method 1200 further includes operation 1225 to form/deposit an MRAM stack. In some instances, this may correspond to intermediate step 600 (FIG. 6) and, more specifically, to depositing the MRAM stack 260 from FIG. 6. In some instances, depositing the MRAM stack may include depositing ferromagnetic plates and insulator layers, with the ferromagnetic plates being separated by an insulator layer. For example, a fixed plate may be deposited, then an insulator layer, then a free plate, then another insulator layer, and so on. In some instances, the MRAM stack may include ferromagnetic plates (e.g., a free plate and/or fixed plate) on the outside layers (i.e., the top and bottom layer) of the MRAM stack.

Method 1200 further includes operation 1230 to deposit a top electrode. Operation 1230 may correspond to depositing top electrode 265 from intermediate step 600 (FIG. 6), in some instances.

Method 1200 further includes operation 1235 to form an MRAM pillar. In some instances, as depicted in FIG. 6, the electrode layer, the MRAM stack, and the top electrode may be deposited in single sheets/layers. In these instances, excess material may need to be removed/patterned in order to form an MRAM pillar structure. This may correspond to intermediate step 700 (FIG. 7), in some instances. In some instances, each layer may be patterned and shaped after it is deposited (but before the next layer is deposited). Because, in operations 1210 and 1215, a dielectric was deposited that may protect the diffusion barrier from patterning/etching, the diffusion barrier may not be exposed to patterning/etching during the formation of the MRAM pillar in operation 1235. Instead, as discussed herein, only the dielectric and the electrode layer may be exposed. The dielectric and the electrode layer may be easy to remove/clean from the MRAM stack, especially compared to the diffusion barrier, therefore any debris (of the dielectric and/or the electrode layer) that is redeposited during the formation process may be removed from the MRAM stack and may not cause shorts or other issues in the functioning of the MRAM stack.

In some instances, although not depicted in FIG. 12, method 1200 may include further operations such as depositing dielectric to encapsulate at least the MRAM stack (corresponding to intermediate step 800 from FIG. 8), depositing additional dielectric layer(s) (for example, corresponding to intermediate step 900 and dielectric 275 from FIG. 9), forming a metal contact connected to the top electrode (corresponding to intermediate step 1000 (FIG. 10) and MRAM structure 1100 (FIG. 11)), etc.

Additionally, although method 1200 is described as forming a single MRAM pillar, a single bottom electrode (with the dielectric, diffusion barrier, and electrode layer), a single MRAM stack, a single top electrode, and so on, any number of MRAM pillars, bottom electrodes, MRAM stacks, etc. may be formed. Further, in some instances, method 1200 may include forming a metal contact, such as metal contact 285 (FIG. 11), that may connect/serve as a contact between various components of the MRAM structure.

The present invention may be a system, a method, a computer program product, etc. at any possible technical detail level of integration.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to some embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A magnetoresistive random access memory (MRAM) structure, wherein the MRAM structure comprises:
    a bottom electrode, the bottom electrode comprising:
        a diffusion barrier;
        a dielectric that surrounds all sidewalls of the diffusion barrier; and
        an electrode layer covering entire top surfaces of the diffusion barrier and the dielectric.

2. The MRAM structure of claim 1, wherein the diffusion barrier comprises at least one of TaN and Ru.

3. The MRAM structure of claim 2, wherein the electrode layer comprises at least one of TiN and W.

4. The MRAM structure of claim 1, further comprising:
    an MRAM stack, wherein the MRAM stack comprises one or more stacks of ferromagnetic plates and insulator layers.

5. The MRAM structure of claim 1, wherein the dielectric comprises at least one of aluminum oxide, hafnium oxide, silicon oxide, SiN, and SiCN.

6. The MRAM structure of claim 1, wherein the diffusion barrier has a thickness between 10 nm and 50 nm.

7. A system, wherein the system comprises:
    a magnetoresistive random access memory (MRAM) structure, the MRAM structure comprising:
    a bottom electrode, the bottom electrode comprising:
        a diffusion barrier,
        a dielectric that surrounds all sidewalls of the diffusion barrier; and
        an electrode layer covering entire top surfaces of the diffusion barrier and the dielectric;
    an MRAM stack; and
    a top electrode.

8. The system of claim 7, wherein the diffusion barrier comprises at least one of TaN and Ru.

9. The system of claim 8, wherein the electrode layer comprises at least one of TiN and W.

10. The system of claim 7, wherein the diffusion barrier has a thickness between 10 nm and 50 nm.

11. The system of claim 7, further comprising a metal component, wherein the metal component is capped by the diffusion barrier.

12. The system of claim 11, wherein the diffusion barrier has a width less than or equal to the metal component.

* * * * *